United States Patent
Chen et al.

(10) Patent No.: US 8,259,890 B2
(45) Date of Patent: Sep. 4, 2012

(54) PHASE-LOCKED LOOP CIRCUIT AND RELATED PHASE LOCKING METHOD

(75) Inventors: Shang-Ping Chen, Tai-Chung (TW); Ding-Shiuan Shen, Chiayi County (TW); Bo-Jiun Chen, Taipei County (TW); Ping-Ying Wang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 779 days.

(21) Appl. No.: 12/372,741

(22) Filed: Feb. 18, 2009

(65) Prior Publication Data

US 2010/0208857 A1  Aug. 19, 2010

(51) Int. Cl.
*H03D 3/24* (2006.01)

(52) U.S. Cl. ......................................... 375/376

(58) Field of Classification Search ............. 375/327, 375/376; 327/156–159; 331/10, 11, 34
See application file for complete search history.

(56) References Cited

U.S. PATENT DOCUMENTS

| | | | |
|---|---|---|---|
| 2007/0247248 A1* | 10/2007 | Kobayashi et al. | 331/167 |
| 2008/0106340 A1* | 5/2008 | Lee et al. | 331/16 |
| 2011/0063969 A1* | 3/2011 | Kawamoto | 369/126 |

FOREIGN PATENT DOCUMENTS

CN  1893331 A  1/2007

OTHER PUBLICATIONS

Ilya Novof, Fully-Integrated CMOS Phase-Locked Loop with 15 to 240MHz Locking Range and +/−50ps Jitter, Feb. 16, 1995, pp. 112-113, and 347, ISSCC95/Session 6/Digital Design Elements/Paper TA 6.5.

Hee-Tae Ahn, A Low-Jitter 1.9-V CMOS PLL for UltraSPARC Microprocessor Applications, Mar. 2000, pp. 450-454, IEEE Journal of Solid-State Circuits, vol. 35, No. 3.

Benyong Zhang et al., "A Fast Switching PLL Frequency Synthesizer With an On-Chip Passive Discrete-Time Loop Filter in 0.25-μm CMOS", Jun. 2003, vol. 38, No. 6, IEEE Journal of Solid-State Circuits, p. 855~865.

Keliu Shu et al., "A 2.4-GHz Monolithic Fractional-N Frequency Synthesizer With Robust Phase-Switching Prescaler and Loop Capacitance Multiplier", Jun. 2003, vol. 38, No. 6, p. 866~874, IEEE Journal of Solid-State Circuits.

Michael H. Perrott et al., "A 2.5-Gb/s Multi-Rate 0.25-μm CMOS Clock and Data Recovery Circuit Utilizing a Hybrid Analog/Digital Loop Filter and All-Digital Referenceless Frequency Acquisition", Dec. 2006, vol. 41, No. 12, p. 2930~2944, IEEE Journal of Solid-State Circuits.

(Continued)

*Primary Examiner* — Don N Vo

(74) *Attorney, Agent, or Firm* — Winston Hsu; Scott Margo

(57) ABSTRACT

A phase-locked loop circuit, including: an operating circuit for detecting a difference between a reference signal and a feedback oscillating signal to generate a detected result, and generating a first control signal according to the detected result, an auxiliary circuit for generating a second control signal that is asynchronous with the first control signal, and a controllable oscillator coupled to the operating circuit and the auxiliary circuit for generating an output oscillating signal according to the first control signal and the second control signal, wherein the feedback oscillating signal is derived from the output oscillating signal.

27 Claims, 12 Drawing Sheets

OTHER PUBLICATIONS

Tai-Cheng Lee et al., "A Stabilization Technique for Phase-Locked Frequency Synthesizers", Jun. 2003, vol. 38, No. 6, p. 888~894, IEEE Journal of Solid-State Circuits.

Masaomi Toyama et al., "A Design of a Compact 2GHz-PLL with a New Adaptive Active Loop Filter Circuit", 2003, p. 185~188, Symposium on VLSI Circuits Digest of Technical Papers.

Ping-Ying Wang et al., "Timing Orthogonal Capacitance Multiplication Technique for Pll", 2007, p. 162~163, Symposium on VLSI Circuits Digest of Technical Papers.

Ping-Ying Wang et al., "A Phase Locked Loop with a Mixed Mode Loop Filter for Clock/Data Recovery in Optical Disc Drives", 2005, p. 5007~5010, IEEE.

Peter J. Lim, "An Area-Efficient PLL Architecture in 90-nm CMOS", 2005, p. 48~49, Symposium on VLSI Circuits Digest of Technical Papers.

Adrian Maxim, "A -86dBc Reference Spurs 1-5GHz 0.13μm CMOS PLL Using a Dual-Path Sampled Loop Filter Architecture", 2005, cover p. + p. 248~251, Symposium on VLSI Circuits Digest of Technical Papers.

* cited by examiner

PHASE-LOCKED LOOP CIRCUIT AND RELATED PHASE LOCKING METHOD

BACKGROUND

The present invention relates to a phase-locked loop circuit and, more particularly, to a phase-locked loop circuit with an I-path and a P-path, and a method thereof.

Please refer to FIG. 1. FIG. 1 is a diagram illustrating a conventional phase-locked loop circuit 100 with a proportional path (P-path) and an integral path (I-path). The phase-locked loop circuit 100 includes a phase/frequency detector 102, a first charge-pump circuit 104, a voltage-controlled oscillator (VCO) 106, a second charge-pump circuit 108, an integrator 110, and a frequency divider 112. The phase/frequency detector 102 detects a phase difference between a reference clock signal $S_{ref}$ and a feedback clock signal $S_f$ to generate a phase error signal $S_e$. The first charge-pump circuit 104 generates a proportional signal $S_p$ for the voltage-controlled oscillator 106 according to the phase error signal $S_e$ while the second charge-pump circuit 108 generates an integral signal $S_i$ for the voltage-controlled oscillator 106. The voltage-controlled oscillator 106 generates an oscillating signal $S_o$ according to the proportional signal $S_p$ and the integral signal $S_i$ outputted by the integrator 110. Then, the frequency divider 112 divides the frequency of the oscillating signal $S_o$ by N to generate the feedback clock signal $S_f$. The phase/frequency detector 102 and the first charge-pump circuit 104 comprise the P-path while the phase/frequency detector 102, the second charge-pump circuit 108, and the integrator 110 comprise the I-path of the phase-locked loop circuit 100. In addition, the open loop transfer function $T_{open}$ of the phase-locked loop circuit 100 is expressed as equation (1):

$$T_{open} = \left(K_p + \frac{K_i}{s \cdot C}\right) \cdot \frac{K_{vco}}{N \cdot s} \qquad (1)$$

wherein Kp is the gain of the P-path and $$\frac{K_i}{s \cdot C}$$

is the gain of the I-path, Ki is the gain of the phase/frequency detector 102 in conjunction with the second charge-pump circuit 108, C is the capacitance of the capacitor in the integrator 110, and s is the so-called s parameter.

One of the main features of the configuration of the phase-locked loop circuit 100 is to save resistors in the loop filter, wherein the resistors would occupy a large area of the total area of the phase-locked loop circuit 100, thereby increasing the cost of the phase-locked loop circuit 100. In the conventional phase-locked loop circuit 100, however, the capacitor in the integrator 110 may still occupy a considerable area of the total area. Since the large occupied area means a correspondingly high cost, how to effectively reduce the total area of the phase-locked loop circuit 100 is an urgent problem in this field.

SUMMARY OF THE INVENTION

One of the objectives of the present invention is to provide a phase-locked loop circuit with a P-path and a down-sampled I-path, and a related phase-locking method.

Another objective of the present invention is to provide a phase-locked loop with an I-path and a P-path, and a controllable oscillator of the phase-locked loop controlled by the I-path and P-path control signals or the sum of the I-path and P-path control signals to generate the output oscillating signal. The I-path and P-path control signals inputted into the controllable oscillator are asynchronous, or the I-path and P-path control signals inputted into the adder that sums the I-path and P-path control signals are asynchronous.

According to a first embodiment of the present invention, a phase-locked loop circuit is disclosed. The phase-locked loop circuit comprises an operating circuit, an auxiliary circuit, and a controllable oscillator. The operating circuit detects a difference between a reference signal and a feedback oscillating signal, and generates a first control signal according to the detected result. The auxiliary circuit generates a second control signal that is asynchronous with the first control signal. The controllable oscillator is coupled to the operating circuit and the auxiliary circuit for generating an output oscillating signal according to the first control signal and the second control signal, wherein the feedback oscillating signal is derived from the output oscillating signal.

According to a second embodiment of the present invention, a phase-locking method for a phase-locked loop circuit is disclosed. The phase-locking method comprises the steps of: detecting a difference between a reference signal and a feedback oscillating signal to generate a first output; generating a first control signal according to the first output; generating a second control signal that is asynchronous with the first control signal; and generating an output oscillating signal according to the first control signal and the second control signal, wherein the feedback oscillating signal is derived from the output oscillating signal.

According to a third embodiment of the present invention, a phase-locked loop circuit is disclosed. The phase-locked loop circuit comprises an operating circuit, a downsampling circuit, an auxiliary circuit, and a controllable oscillator. The detecting circuit detects a difference between a reference signal and a feedback oscillating signal to generate a first control signal. The downsampling circuit is coupled to the operating circuit for downsampling the difference between the reference signal and the feedback oscillating signal. The auxiliary circuit is coupled to the downsampling circuit for generating a second control signal according to an output of the downsampling circuit. The controllable oscillator is coupled to the operating circuit and the auxiliary circuit for generating an output oscillating signal according to the first control signal and the second control signal, wherein the feedback oscillating signal is derived from the output oscillating signal.

According to a fourth embodiment of the present invention, a capacitive circuit is disclosed. The capacitive circuit comprises a frequency divider for frequency-dividing a control signal to generate a frequency-divided signal, and a capacitive component charged by a current corresponding to the frequency-divided signal. The frequency divider divides a frequency of the control signal by M when a capacitance of the capacitive component is designed to be multiplied by M.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
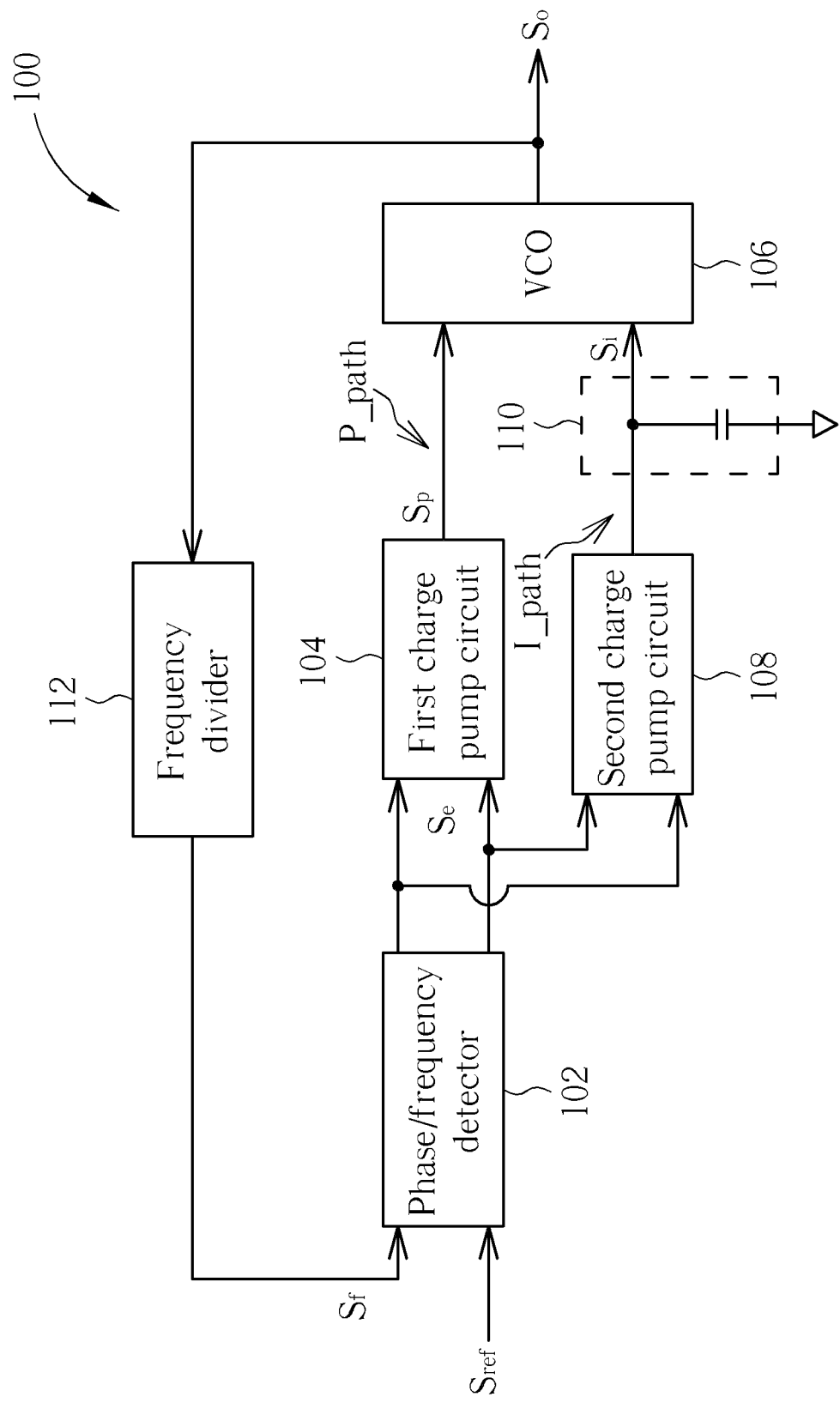
FIG. 1 is a diagram illustrating a conventional phase-locked loop circuit with a proportional path and an integral path.
Figure 2:
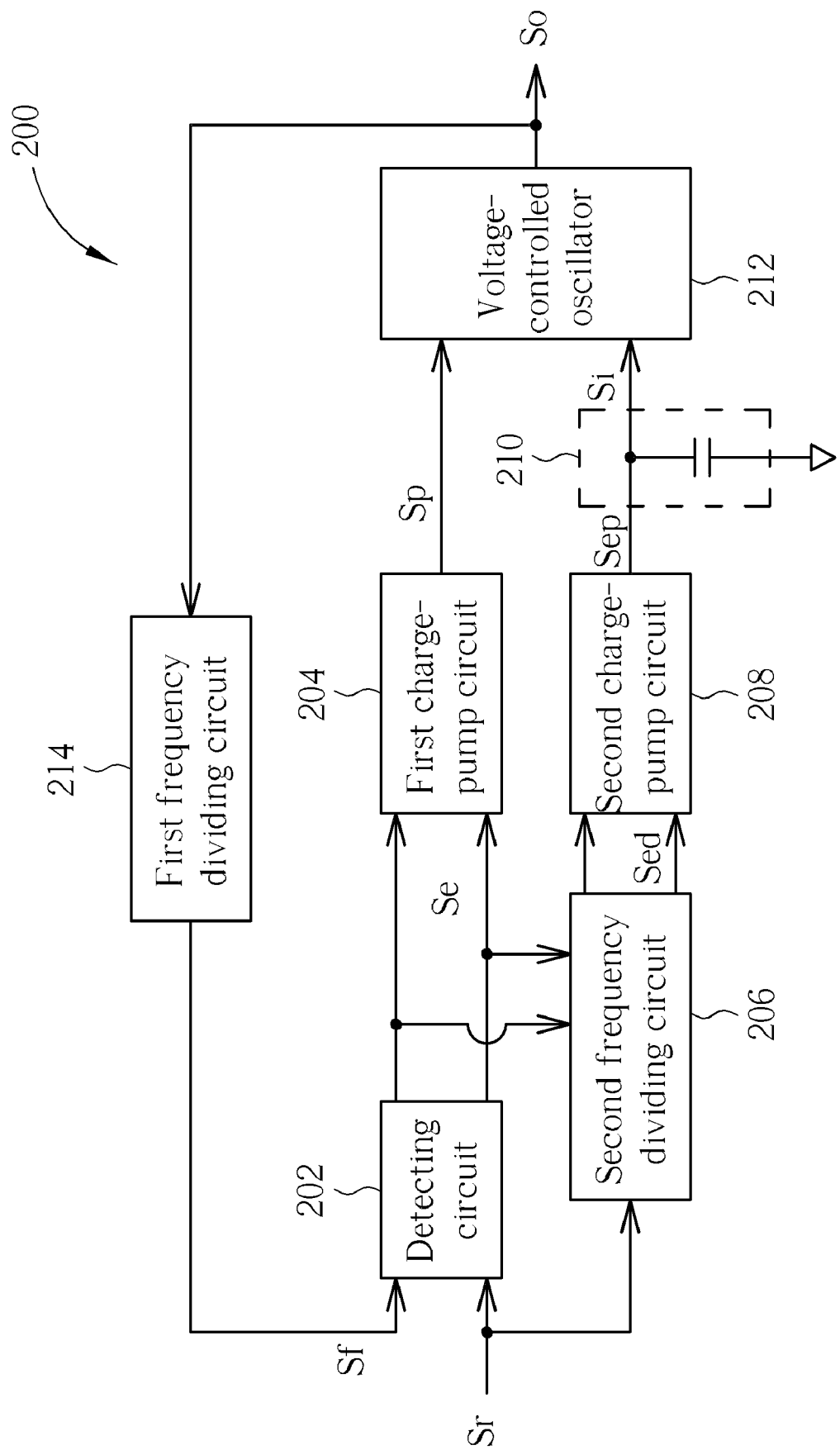
FIG. 2 is a diagram illustrating a phase-locked loop circuit according to a first embodiment of the present invention.

Please refer to FIG. 2. FIG. 2 is a diagram illustrating a phase-locked loop circuit 200 according to a first embodiment of the present invention. The phase-locked loop circuit 200 comprises an operating circuit comprising a detecting circuit 202 and a first charge-pump circuit 204, a first frequency dividing circuit 214, an auxiliary circuit comprising a second frequency dividing circuit 206, a second charge-pump circuit 208 and an integrator 210 (which is implemented using a capacitive component in this embodiment) providing similar functions to the integrator 110, and a voltage-controlled oscillator 212. In an embodiment, the frequency dividing circuit 206 frequency-divides a control signal, e.g. the output of the detecting circuit 202, to generate a frequency-divided signal Sed, and the capacitive component 210 is charged by a current corresponding to the frequency-divided signal Sed; wherein the frequency dividing circuit 206 divides a frequency of the control signal by Y when a capacitance of the capacitive component 210 is designed to be multiplied by Y. The detecting circuit 202 is utilized for detecting a difference, for example a phase difference or a frequency difference, between a feedback oscillating signal Sf and a reference signal Sr to generate a detected result, i.e., an error signal Se, corresponding to the difference. The first charge-pump circuit 204 generates a first control signal Sp to the voltage-controlled oscillator 212 according to the error signal Se. The second frequency dividing circuit 206 divides a frequency of the error signal Se by a predetermined number M to generate a frequency-divided signal Sed, e.g., M=2. Therefore, the frequency of the frequency-divided signal Sed is slower than the frequency of the error signal Se, and the operating frequency of the auxiliary circuit is lower than that of the operating circuit. Please note that the predetermined number M of the second frequency dividing circuit 206 may be controlled by the reference signal Sr, but this is not meant to be a limitation of the present invention. Furthermore, the error signal Se is a pulse signal, in which the pulses of the error signal Se correspond to the differences (e.g. phase differences) between the feedback oscillating signal Sf and the reference signal Sr. The second charge-pump circuit 208 generates a signal Sep according to the frequency-divided signal Sed. The integrator 210, which consists of a capacitor with a capacitance $C_1$ in this embodiment, integrates the output of the second charge pump 208 to generate a second control signal Si to the voltage-controlled oscillator 212. Hence, the update frequencies of the first control signal Sp and the second control signal Si are different; the update frequency of the second control signal Si is lower than that of the first control signal Sp in this embodiment. Then, the voltage-controlled oscillator 212 outputs an oscillating signal So according to the first control signal Sp and the second control signal Si. Please note that the present invention is not limited to utilizing a voltage-controlled oscillator for generating the oscillating signal So; any other controllable oscillator belongs to the scope of the present invention. For example, a current-controlled oscillator is utilized to generate the oscillating signal So in another embodiment of the present invention. The first frequency dividing frequency 214 divides a frequency of the oscillating signal So by a predetermined number N to generate the feedback oscillating signal Sf for the detecting circuit 202, wherein the predetermined number N may be an integer or a fraction. In addition, the detecting circuit 202 and the first charge-pump circuit 204 comprise a proportional path (P-path) while the detecting circuit 202, the second frequency dividing circuit 206, the second charge-pump circuit 208, and the integrator 210 comprise an integral path (I-path) of the phase-locked loop circuit 200.

According to the s-parameter analysis upon the phase-locked loop circuit 200, the open loop transfer function $H_{open}$ of the phase-locked loop circuit 200 can be expressed as equation (2):

$$H_{open} = \left(K_p + \frac{K_i}{M \cdot s \cdot C_1}\right) \cdot \frac{K_{vco}}{N \cdot s} \qquad (2)$$

wherein $K_p$ is the gain of the P-path and $$\frac{K_i}{M \cdot s \cdot C_1}$$

is the gain of the I-path, in which $$\frac{K_i}{M}$$

which is the gain of the detecting 202 in conjunction with the second frequency dividing circuit 206 and the second charge-pump circuit 208, $C_1$ is the capacitance corresponding to the integrator 210, and s is the so-called s parameter. Compared with the above-mentioned equation (1), an effect of capacitor multiplication, i.e., $M \cdot C_1$, is achieved in the equation (2). More specifically, as can be seen by referring to equation (2) and the above-mentioned equation (1), the open loop transfer function $H_{open}$ of the phase-locked loop circuit 200 will equal the open loop transfer function $T_{open}$ of the phase-locked loop circuit 100 if the capacitance $C_1$ corresponding to the integrator 210 is designed as C/M. In other words, the phase-locked loop circuit 200 achieves the same open loop transfer as the phase-locked loop circuit 100 with the area occupied by the integrator 210 is M times smaller than the capacitor in the integrator 110. Accordingly, an inversely proportional relationship between the area of the integrator 210 and the predetermined number M of the second frequency dividing circuit 206 is achieved. Therefore, the characteristic of capacitor multiplication of the present invention will greatly reduce the area of the capacitor in the loop-filter and consequently lower the cost of the phase-locked loop circuit 200.

Because of the second frequency dividing circuit 206, the charging frequency in the I-path is slower than that in the P-path (for example, the charging in the P-path is performed every reference cycle, and the charging in the I-path is performed every M reference cycle), making the capacitance $C_1$ equivalent to M times the capacitance C. In another embodiment, the second frequency dividing circuit 206 is a time-interleaver that generates a window for retrieving the output of the detecting circuit 202 at appropriate time intervals (e.g. the window retrieve one pulse of the error signal Se each time M pulses of the error signal Se pass), in order to downsample the error signal Se. The integrator 210 is then charged by the downsampled signal Sed, resulting in the capacitance multiplication. Therefore, a person with ordinary skill in the art should appreciate that the above embodiments should be taken as examples of the second frequency dividing circuit 206 rather than limitations.

Figure 11:
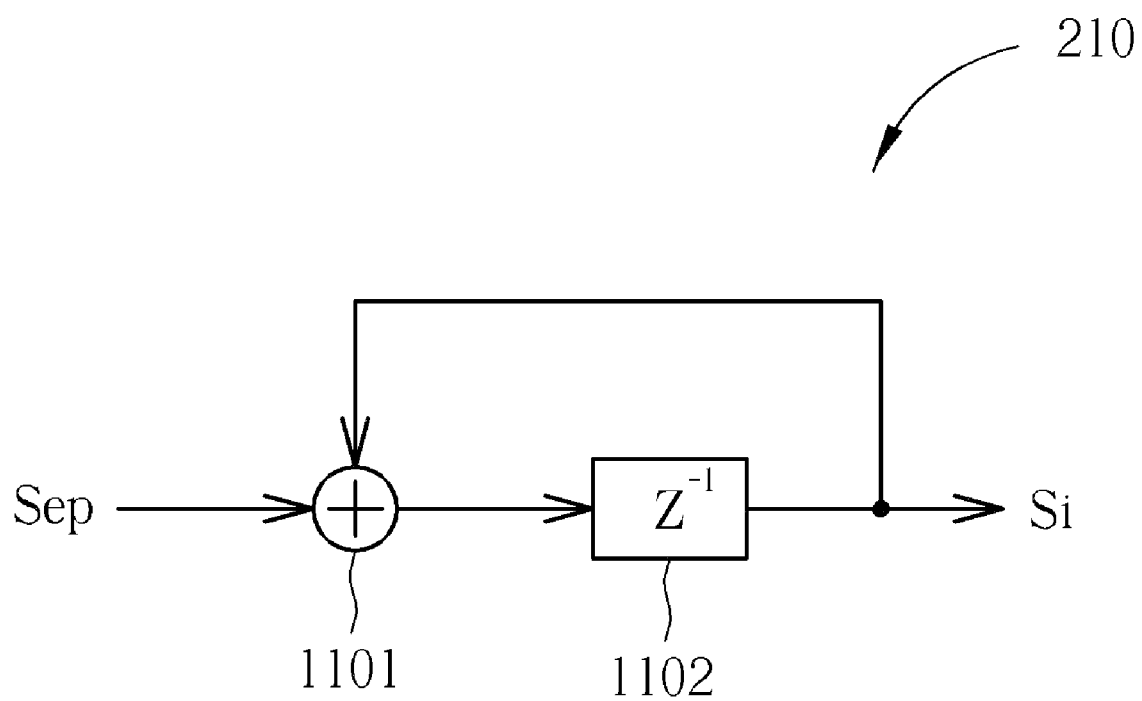
FIG. 11 is a diagram illustrating an integrator according to one embodiment of the present invention.

In addition, the integrator 210 is not limited to be implemented by a capacitor. In another embodiment, as shown in FIG. 11, the integrator 210 may comprise an accumulator 1101 and a delay circuit 1102 (i.e. $Z^{-1}$). FIG. 11 is a diagram illustrating the integrator 210 according to one embodiment of the present invention.

According to the first embodiment of the present invention, since the frequency-divided signal Sed is synchronous with the error signal Se (i.e. one of every M pulses of the frequency-divided signal Sed is overlapped with the pulse of the error signal Se), the P-path control signal Sp and I-path control signal Si may interfere with each other. In the situation that the control signals Sp and Si simultaneously enter the VCO 212, the transient current becomes large. This may cause large spurious tones to appear in the oscillating signal So of the voltage-controlled oscillator 212.

Figure 3:
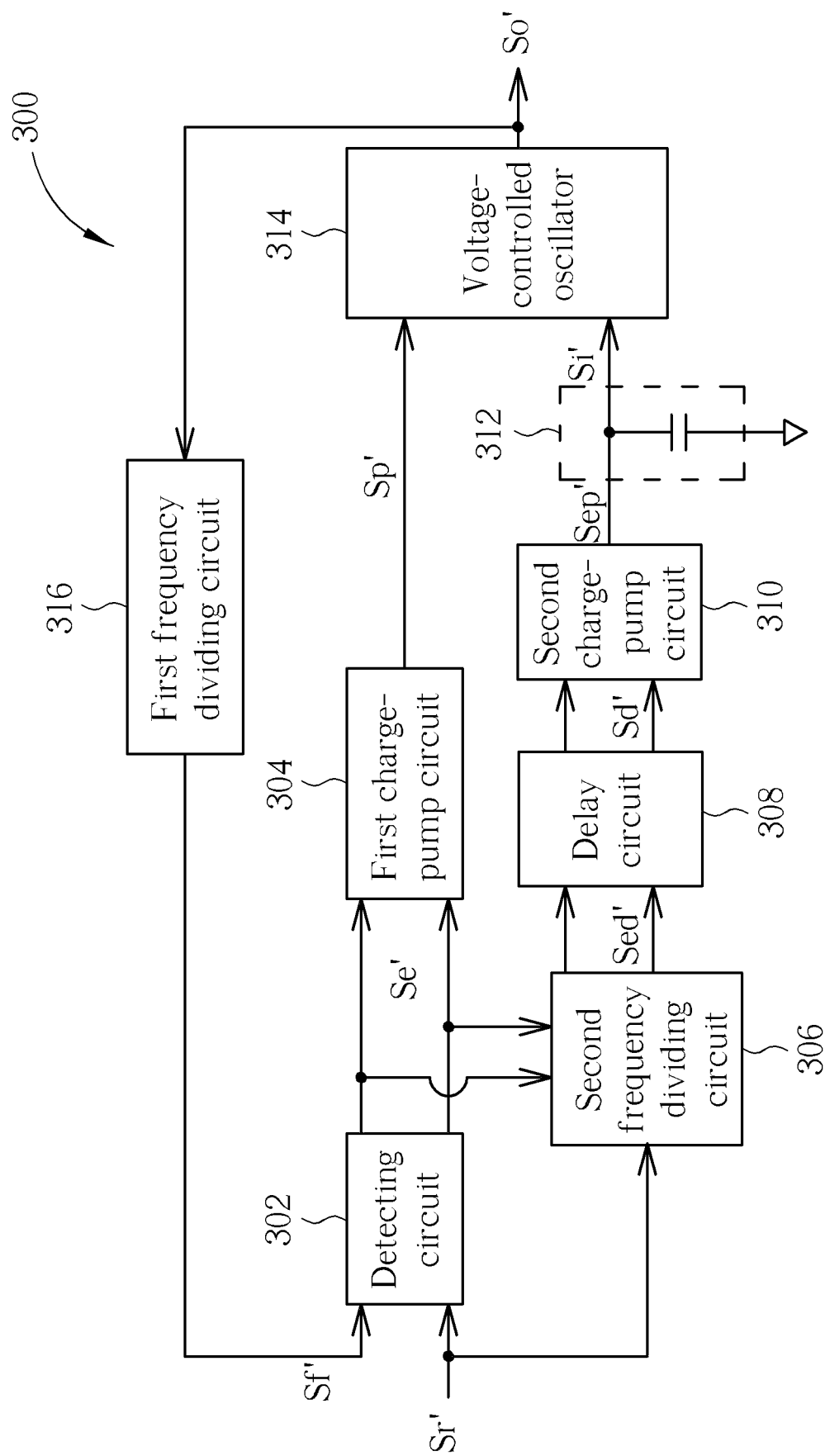
FIG. 3 is a diagram illustrating a phase-locked loop circuit according to a second embodiment of the present invention.

To overcome the large spurious tones of the oscillating signal So of the phase-locked loop circuit 200, the auxiliary circuit further includes a delay circuit 308, as shown in FIG. 3, which is a diagram illustrating a phase-locked loop circuit 300 according to a second embodiment of the present invention. The frequency-divided signal Sed' of the I-path is delayed by a specific interval to decrease or to prevent signal overlap with the P-path. Please note that the present invention is not limited to delaying the frequency-divided signal Sed' of the I-path: delaying the error signal Se' in the P-path can also achieve the purpose of de-overlapping the signals of the I-path and the P-path, which also belongs to the scope of the present invention. Similar to the first embodiment, the detecting circuit 302 is utilized for detecting a phase difference between a feedback oscillating signal Sf and a reference signal Sr' to generate a detected result, i.e., an error signal Se', corresponding to the phase difference. The first charge-pump circuit 304 generates a first control signal Sp' to the voltage-controlled oscillator 314 according to the error signal Se'. The second frequency dividing circuit 306 divides a frequency of the error signal Se' (or downsamples the error signal Se') by a predetermined number M' to generate a frequency-divided signal Sed', e.g., M'=2. The delay circuit 308 delays an interval T for the frequency-divided signal Sed' to generate a delayed signal Sd'. The second charge-pump circuit 310 generates a signal Sep' according to the delayed signal Sd'. The integrator 312, which consists of a capacitor with a capacitance $C_1'$, integrates the signal Sep' to generate a second control signal Si' to the voltage-controlled oscillator 314. Then, the voltage-controlled oscillator 314 outputs an oscillating signal So' according to the first control signal Sp' and the second control signal Si'. Moreover, a low-pass filter (not shown) can be added between the integrator 312 and the oscillator 314 for smoothing the second control signal Si'. Please note that the predetermined number M' of the first frequency dividing circuit 306 may be controlled by the reference signal Sr', but this is not meant to be a limitation of the present invention.

Figure 4:
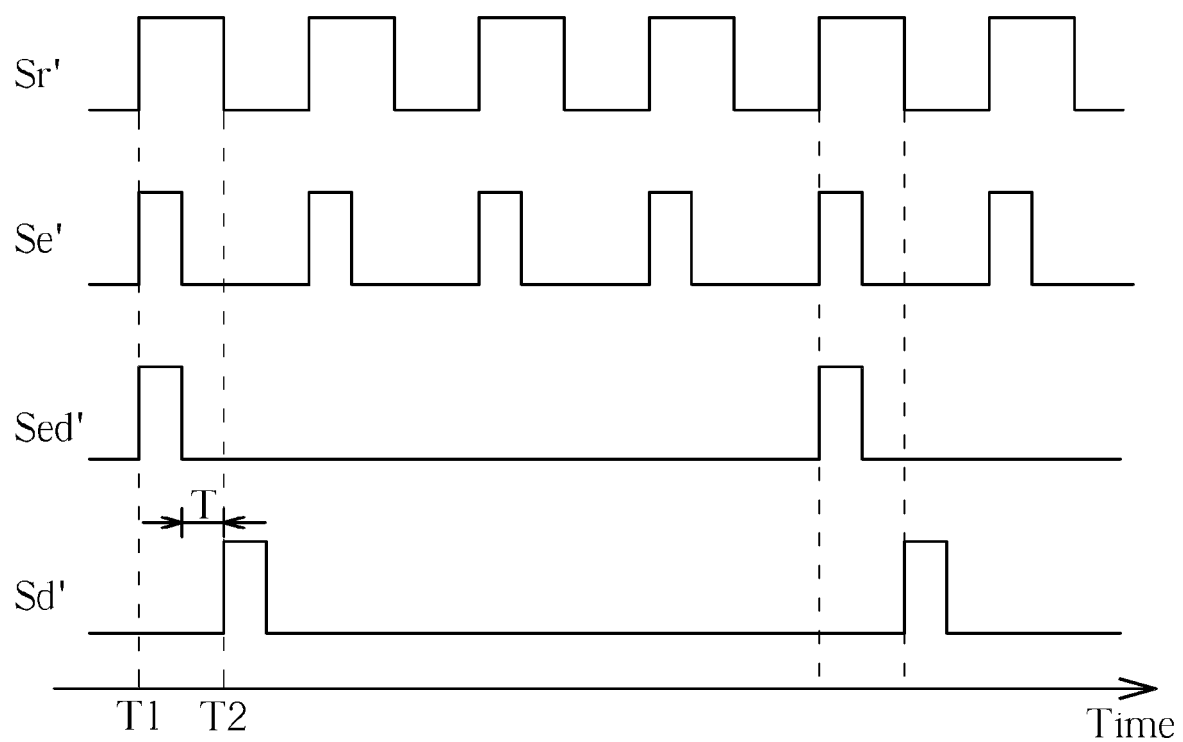
FIG. 4 is a timing diagram illustrating a reference oscillating signal, a error signal, a frequency-divided signal, and a delayed signal of the phase-locked loop circuit shown in FIG. 3.

Please refer to FIG. 4. FIG. 4 is a timing diagram illustrating the reference signal Sr', the error signal Se', the frequency-divided signal Sed', and the delayed signal Sd' of the phase-locked loop circuit 300. For simplicity, it is assumed that the pulses of the error signal Se' are generated in every cycle of the reference signal Sr'. The second frequency dividing circuit 306 divides the error signal Se' to generate the frequency-divided signal Sed' that is substantially synchronous with the error signal Se'. Then, the delay circuit 308 delays the frequency-divided signal Sed' by the interval T to make the frequency-divided signal Sed' and the error signal Se' asynchronous (e.g. to stagger the rising edges of the frequency-divided signal Sed' and the error signal Se'), and to generate the delayed signal Sd'. It can be viewed that the first charge-pump circuit 304 generates the first control signal Sp' for the voltage-controlled oscillator 314 at time T1, and the second charge-pump circuit 310 generates the signal Sep' at time T2. Then, the voltage-controlled oscillator 314 generates the oscillating signal So' in response to the non-overlapped control signals, which are the first control signal Sp' and the second control signal Si'. Therefore, the large spurious tones as mentioned in the first embodiment will not appear in this embodiment since the signal of the P-path (which comprises the detecting circuit 302 and the first charge-pump circuit 304) and the signal of the I-path (which comprises the detecting circuit 302, the delay circuit 308, the second charge-pump circuit 310, and the integrator 312) of the phase-locked loop circuit 300 may not interfere with each other. However, it should be noted that the first control signal Sp' and the second control signal Si' are not limited to be completely non-overlapped; as long as the control signals inputted into the VCO 314 are asynchronous with each other, the effect of spurious tones can be decreased.

Figure 5:
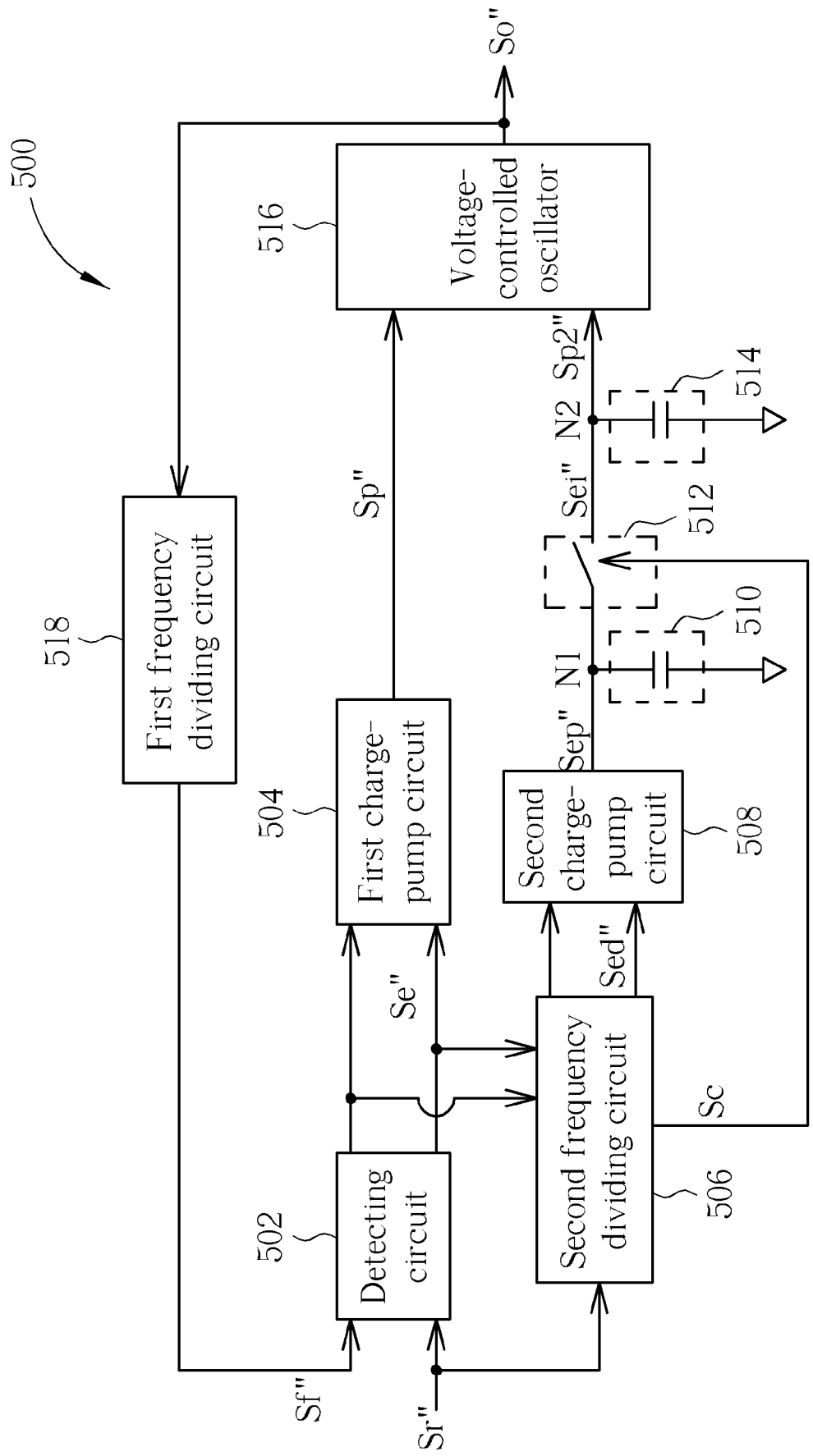
FIG. 5 is a diagram illustrating a phase-locked loop circuit according to a third embodiment of the present invention.

The delay circuit 308 may be implemented by a delay line. In another embodiment, a switch circuit can be utilized to selectively couple the second control signal Sep' to the integrator as shown in FIG. 5. FIG. 5 is a diagram illustrating a phase-locked loop circuit 500 according to a third embodiment of the present invention. The phase-locked loop circuit 500 comprises a detecting circuit 502, a first charge-pump circuit 504, a second frequency dividing circuit 506, a second charge-pump circuit 508, a first integrator 510 (which is implemented using a capacitor in this embodiment), a switch circuit 512, a second integrator 514 (which is implemented using a capacitor in this embodiment), a voltage-controlled oscillator 516, and a first frequency dividing circuit 518. Similar to the second embodiment, the second charge-pump circuit 508 generates a signal Sep" according to the frequency-divided signal Sed". The integrator 510 has a terminal N1 that is coupled to the second charge-pump circuit 508 in order to provide a pre-charged capacitor for the signal Sep". The switch circuit 512 is coupled to the terminal N1 to selectively transmit the signal Sep" to the integrator 514. Please note that the signal transmitted to a terminal N2 of the switch circuit 512 is denoted as a transmitted signal Sei". The integrator 514 integrates the transmitted signal Sei" to generate a second control signal Sp2" that is transmitted to the voltage-controlled oscillator 516. Then, the voltage-controlled oscillator 516 outputs an oscillating signal So" according to the first control signal Sp" and the second control signal Sp2". Please note that the predetermined number M" of the second frequency dividing circuit 506 may be controlled by the reference oscillating signal Sr", but this is not meant to be a limitation of the present invention.

According to the phase-locked loop circuit 500, the frequency-divided signal Sed" generated by the second frequency dividing circuit 506 is substantially overlapped with the error signal Se", then the second charge-pump circuit 508 performs a charge-pump operation upon the frequency-divided signal Sed" to generate the signal Sep" at the terminal N1 of the integrator 510. Meanwhile the first charge-pump circuit 504 generates the first control signal Sp". Therefore, the signal Sep" is substantially synchronous with the first control signal Sp". To make the first control signal Sp" and the second control signal Sp2" asynchronous, a switching control signal Sc generated by the second frequency dividing circuit 506 can be utilized to control the on/off operation of the switch circuit 512. When the switch circuit 512 is on, the signal Sep" transmits to the terminal N2 and becomes the transmitted signal Sei", in which the transmitted signal Sei" can be asynchronous with the first control signal Sp" through the appropriate controlling of the switching control signal Sc. For example, if the first control signal Sp" of the P-path (which comprises the detecting circuit 502 and the first charge-pump circuit 504) is generated at the rising edge of the reference signal Sr", then the switching control signal Sc turns on the switch circuit 512 at the falling edge of the reference signal Sr". Please note that the frequency of the switching control signal Sc is not necessarily equal to the frequency of the reference signal Sr".

Figure 6:
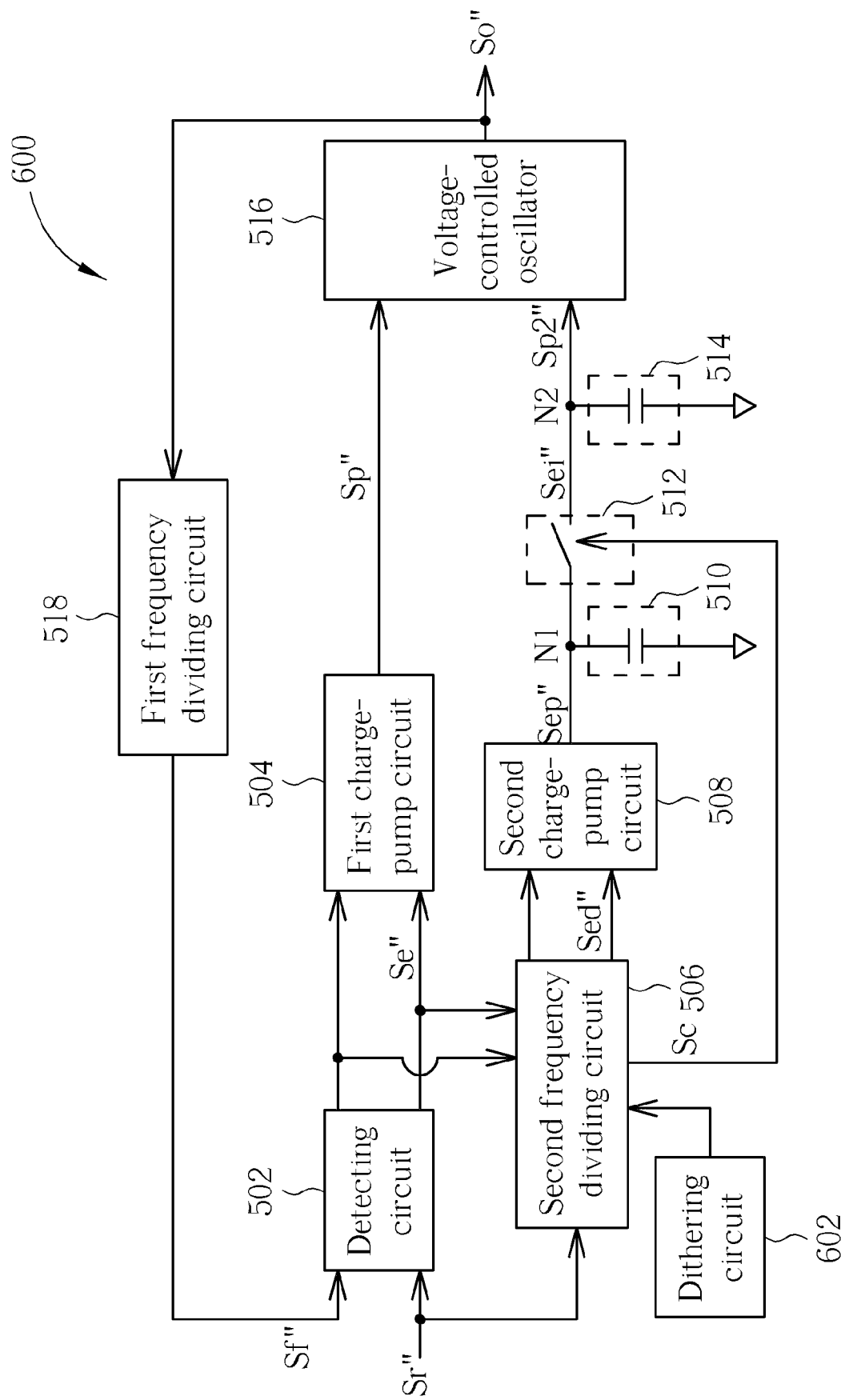
FIG. 6 is a diagram illustrating a phase-locked loop circuit according to a fourth embodiment of the present invention.
Figure 7:
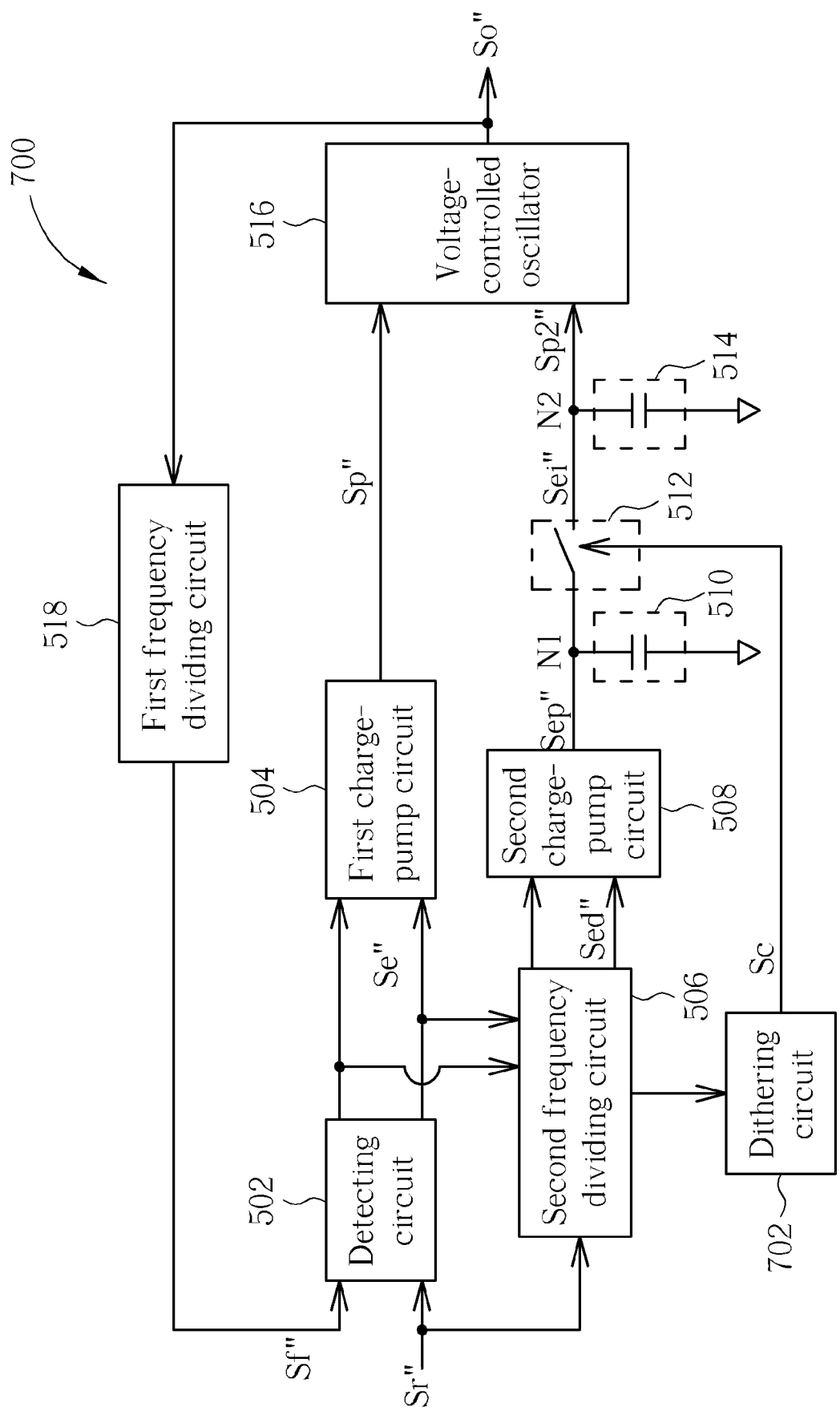
FIG. 7 is a diagram illustrating a phase-locked loop circuit according to a fifth embodiment of the present invention.

When the error signal Se" is frequency divided into a lower frequency frequency-divided signal Sed" by the second frequency dividing circuit 506 (i.e., the error signal Se" is down-sampled to the frequency-divided signal Sed"), and when the switching control signal Sc switches the switch circuit 512, down sampling spurs may emerge in the oscillating signal So". To improve the problem of the down sampling spurs, a dithering circuit is included in another embodiment of the present invention as shown in FIG. 6 and FIG. 7. FIG. 6 is a diagram illustrating a phase-locked loop circuit 600 according to a fourth embodiment of the present invention. In comparison with the phase-locked loop circuit 500 as shown in FIG. 5, a dithering circuit 602 is included in the phase-locked loop circuit 600. The dithering circuit 602 is coupled to the second frequency dividing circuit 506 and performs a high order sigma-delta modulation (SDM) upon the second frequency dividing circuit 506 to improve the down sampling spurs of the oscillating signal So". More specifically, the dithering circuit 602 performs the high order sigma-delta modulation upon the predetermined number M" of the second frequency dividing circuit 506. Since the phase-locked loop circuit 600, except for the dithering circuit 602, is similar to the phase-locked loop circuit 500, a detailed description is omitted here for brevity.

FIG. 7 is a diagram illustrating a phase-locked loop circuit 700 according to a fifth embodiment of the present invention. In comparison with the phase-locked loop circuit 500 as shown in FIG. 5, a dithering circuit 702 is included in the phase-locked loop circuit 700. Similar to the above-mentioned phase-locked loop circuit 600, the dithering circuit 702 is coupled between the second frequency dividing circuit 506 and the switch circuit 512 to perform high order sigma-delta modulation upon the switching control signal Sc to improve the down sampling spurs of the oscillating signal So". Since the phase-locked loop circuit 700, except for the dithering circuit 702, is similar to the phase-locked loop circuit 500, a detailed description is omitted here for brevity.

Figure 12:
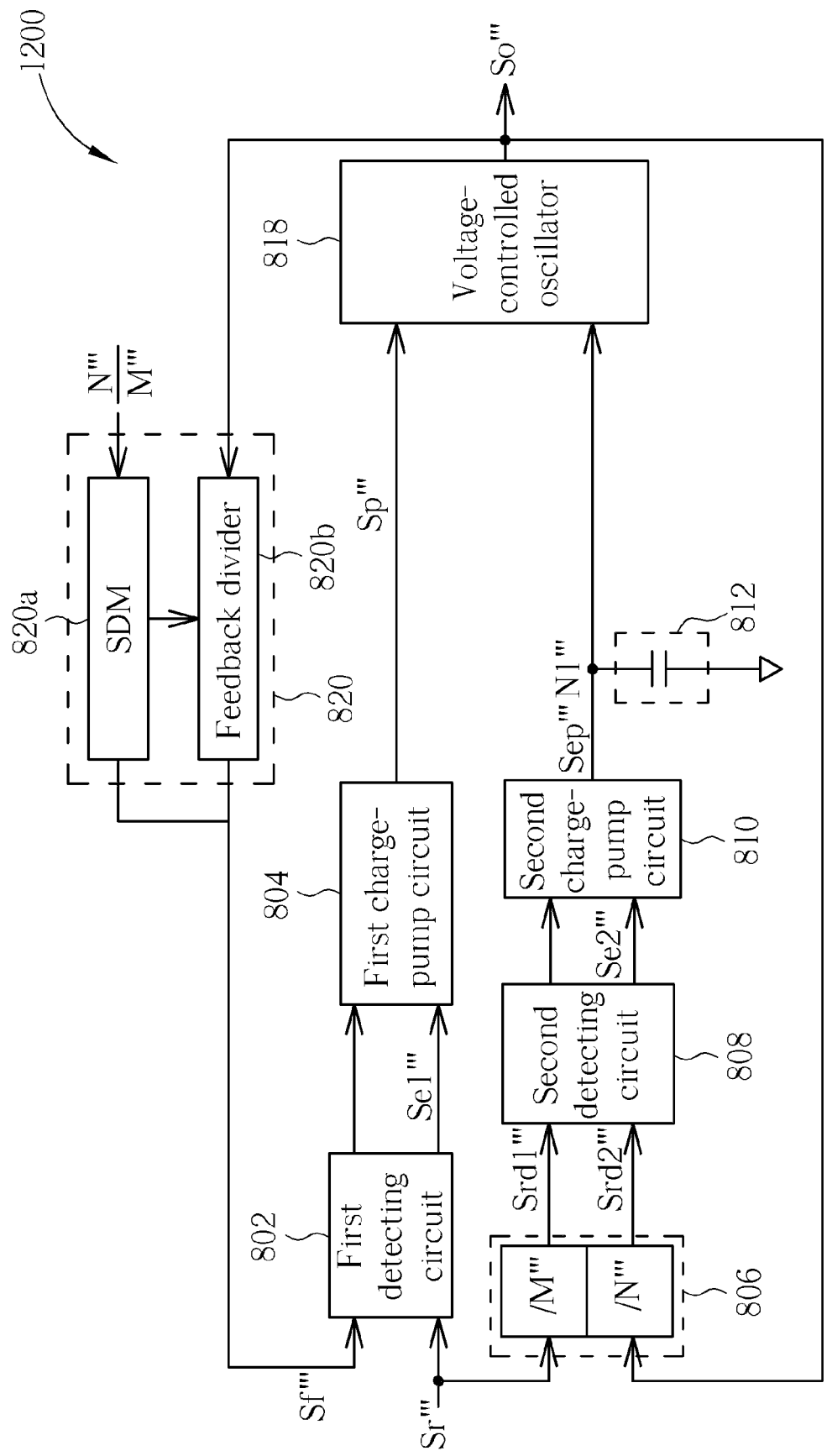
FIG. 12 is a diagram illustrating a phase-locked loop circuit according to a sixth embodiment of the present invention.

FIG. 12 is a diagram illustrating the phase-locked loop circuit 1200 according to a sixth embodiment of the present invention. The phase-locked loop circuit 1200 comprises a first detecting circuit 802, a first charge-pump circuit 804, a second frequency dividing circuit 806, a second detecting circuit 808, a second charge-pump circuit 810, a first integrator 812, a voltage-controlled oscillator 818, and a first frequency dividing circuit 820. The first frequency dividing circuit 820 is a fractional divider which divides a frequency of the oscillating signal So''' by a predetermined number of $$\frac{N'''}{M'''},$$

where N''' and M''' can be integers or fractions. The first detecting circuit 802 is utilized for detecting a phase difference between a feedback oscillating signal Sf''' and a reference signal Sr''' to generate a first error signal Se1''' corresponding to the phase difference. The first charge-pump circuit 804 generates a first control signal Sp''' to the voltage-controlled oscillator 818 according to the first error signal Se'''. The second frequency dividing circuit 806 divides a frequency of the reference signal Sr''' by a first predetermined number M''' to generate a first frequency-divided signal Srd1''', and divides a frequency of an oscillating signal So''' by a second predetermined number N''' to generate a second frequency-divided signal Srd2'''. The second detecting circuit 808 detects a phase difference between the first frequency-divided signal Srd1''' and the second frequency-divided signal Srd2''' to generate a second error signal Se2''' corresponding to the phase difference. The second charge-pump circuit 810 generates a signal Sep''' according to the second error signal Se2'''. The integrator 812 has a terminal N1''' that is coupled to the second charge-pump circuit 810 and the voltage-controlled oscillator 818 in order to provide the second control signal Si'''. Then, the voltage-controlled oscillator 818 outputs the oscillating signal So''' according to the first control signal Sp''' and the second control signal Si'''. Furthermore, the first frequency dividing circuit 820 divides a frequency of the oscillating signal So''' by the predetermined number of $$\frac{N'''}{M'''}$$

to generate the feedback oscillating signal Sf''' for the first detecting circuit 802. In addition, the first frequency dividing circuit 820 comprises a sigma-delta modulator (SDM) 820a and a feedback divider 820b. The third predetermined number $$\frac{N'''}{M'''}$$

is inputted to the sigma-delta modulator 820a, and the feedback divider 820b divides the frequency of the oscillating signal So''' according to an output of the sigma-delta modulator 820a. Furthermore, the feedback oscillating signal Sf''' is also fed to the sigma-delta modulator 820a as shown in FIG. 12. Since the operation of the first frequency dividing circuit 820 is well-known to those skilled in this art, a detailed description is omitted here for brevity.

Figure 8:
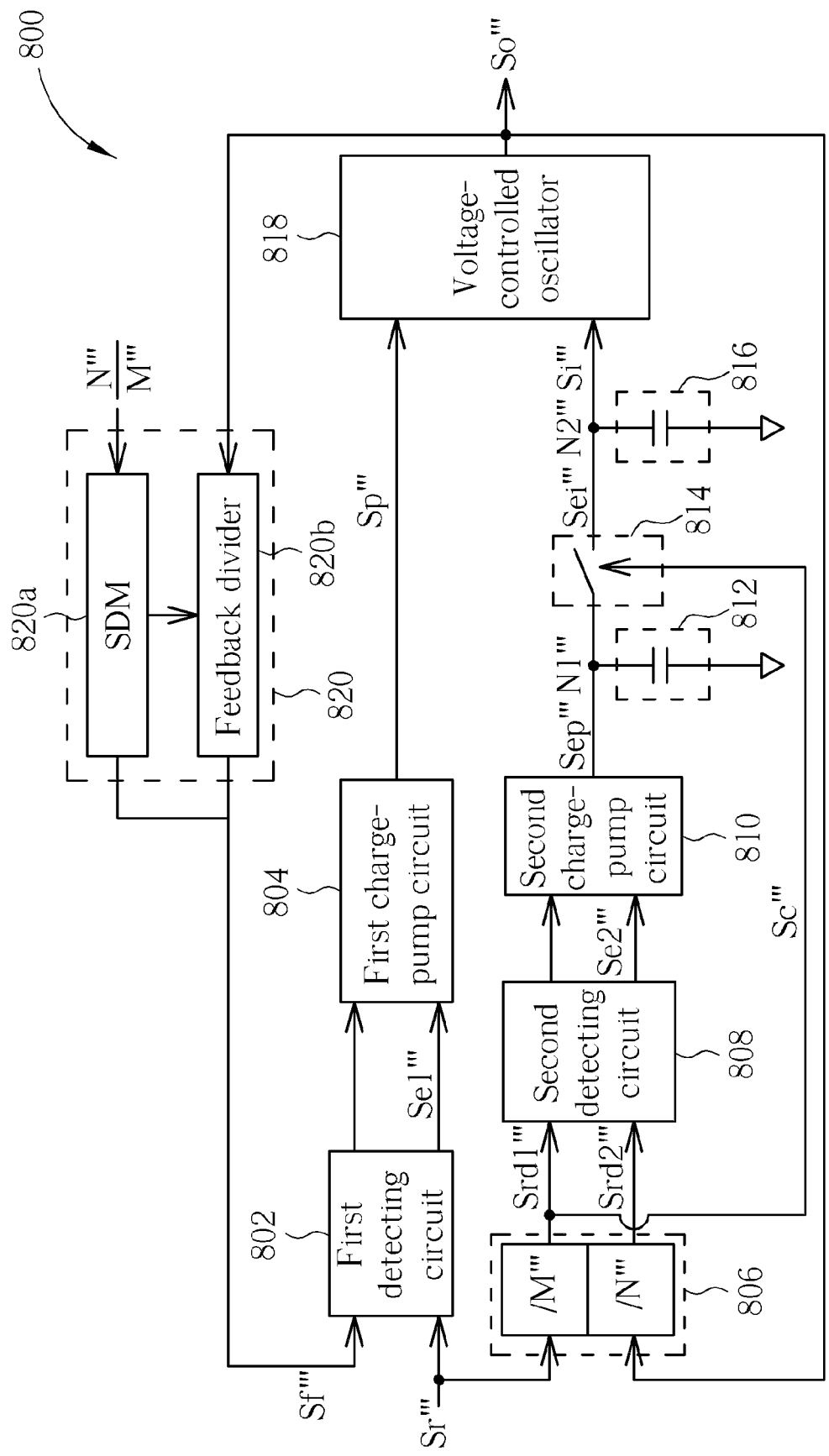
FIG. 8 is a diagram illustrating a phase-locked loop circuit according to a seventh embodiment of the present invention.

In anther embodiment, as shown in FIG. 8, the phase-locked loop 800 further comprises a switch circuit 814 and a second integrator 816 having a terminal N2''' coupled to the voltage-controlled oscillator 818. The switch circuit 814 is coupled to the terminal N1''' to selectively transmit the signal Sep''' to the second integrator 816. Please note that the signal transmitted to a terminal N2''' of the switch circuit 814 is denoted as a transmitted signal Sei'''. The integrator 816, which consists of a capacitor with a capacitance $C_1'''$, integrates the transmitted signal Sei''' to generate a second control signal Si''' to the voltage-controlled oscillator 816.

Since the second frequency dividing circuit 806 divides the reference signal Sr''' by M''' and divides the oscillating signal So''' by N''', the first frequency-divided signal Srd1''' may have the same frequency as the second frequency-divided signal Srd2''', and thus the frequencies of the first frequency-divided signal Srd1''' and the second frequency-divided signal Srd2''' are lower than the frequency of the reference signal Sr'''. In this case, the second detecting circuit 808 generates the second error signal Se2''' according to the first frequency-divided signal Srd1''' and the second frequency-divided signal Srd2'''. Accordingly, the first error signal Se1''' may synchronize with the second error signal Se2'''. To make the first control signal Sp''' and the second control signal Si''' asynchronous, the switch circuit 814 controlled by the switching control signal Sc''' is placed between the terminal N1''' and N2'''. When the switch circuit 814 is on, the signal Sep''' transmits to the terminal N2''' and becomes the transmitted signal Sei''', in which the transmitted signal Sei''' can be asynchronous with the first control signal Sp''' through the appropriate controlling of the switching control signal Sc'''. In this embodiment, it is assumed that the first error signal Se1''' is generated at each rising edge of the reference signal Sr''', and the switching control signal Sc''' turns on the switch circuit 814 at the falling edge of the reference signal Sr'''. Furthermore, the switching control signal Sc''' is the first frequency-divided signal Srd1''' in this embodiment, but this is not meant to be the limitation of the present invention. In other words, the switching control signal Sc''' can be the second frequency-divided signal Srd2''' in another embodiment of the present invention.

Compared with above embodiments, the phase-locked loop circuit 800 comprises two detecting circuits (i.e. the first detecting circuit 802 and the second detecting circuit 808), and the frequency dividing of the second frequency dividing circuit 806 is performed prior to the phase detecting. The detecting circuits 802 and 806 can be implemented by phase-frequency detectors (PFD) or phase detectors (PD). Moreover, when the predetermined number $$\frac{N'''}{M'''}$$

is an integer, the output oscillating signal So''' is not necessary to be frequency divided by N'''; that is, the functional block (/N''') of the second frequency dividing circuit 806 can be omitted, and the second frequency-divided signal Srd2''' equals to the output oscillating signal So'''.

Figure 9:
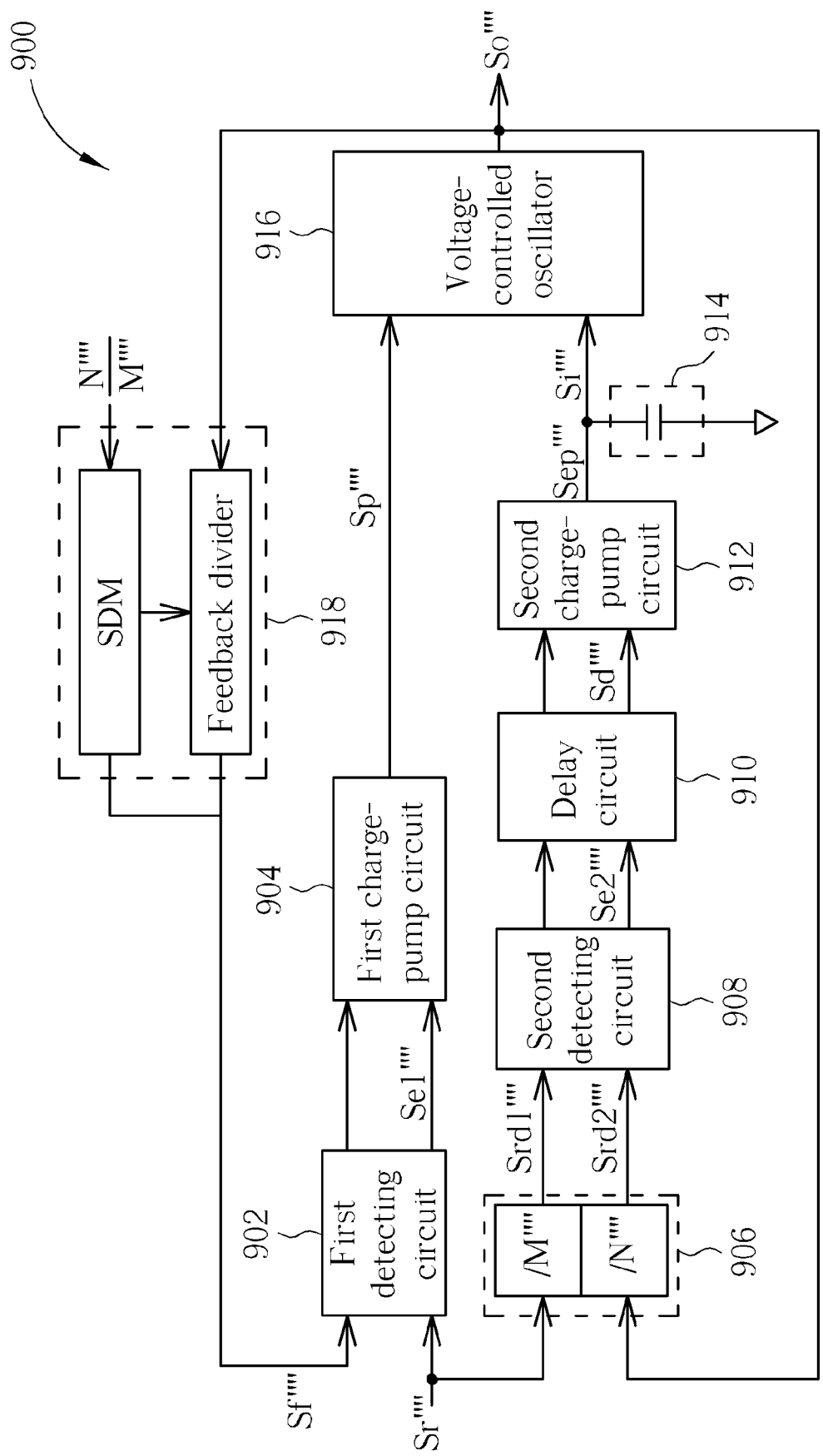
FIG. 9 is a diagram illustrating a phase-locked loop circuit according to a eighth embodiment of the present invention.

It should be noted that a delay circuit can also be utilized to make the first control signal Sp''' and the second control signal Si''' asynchronous as shown in FIG. 9. FIG. 9 is a diagram illustrating the phase-locked loop circuit 900 according to a eighth embodiment of the present invention. The phase-locked loop circuit 900 comprises a first detecting circuit 902, a first charge-pump circuit 904, a second frequency dividing circuit 906, a second detecting circuit 908, a delay circuit 910, a second charge-pump circuit 912, an integrator 914, a voltage-controlled oscillator 916, and a first frequency dividing circuit 918.

Similar to the embodiment 800, the first error signal Se1'''' is synchronous with the second error signal Se2''''. Then, the delay circuit 910 is utilized for delaying the second error signal Se2'''' by the interval T''''. Therefore, the first control signal Sp'''' will be asynchronous with the second control signal Si'''' through the appropriate setting of the interval T''''. Since the phase-locked loop circuit 900 is similar to the phase-locked loop circuit 800, and those skilled in this art will readily understand the operation of the phase-locked loop circuit 900 after reading the disclosure of the phase-locked loop circuit 800, a detailed description is omitted here for brevity.

Figure 10:
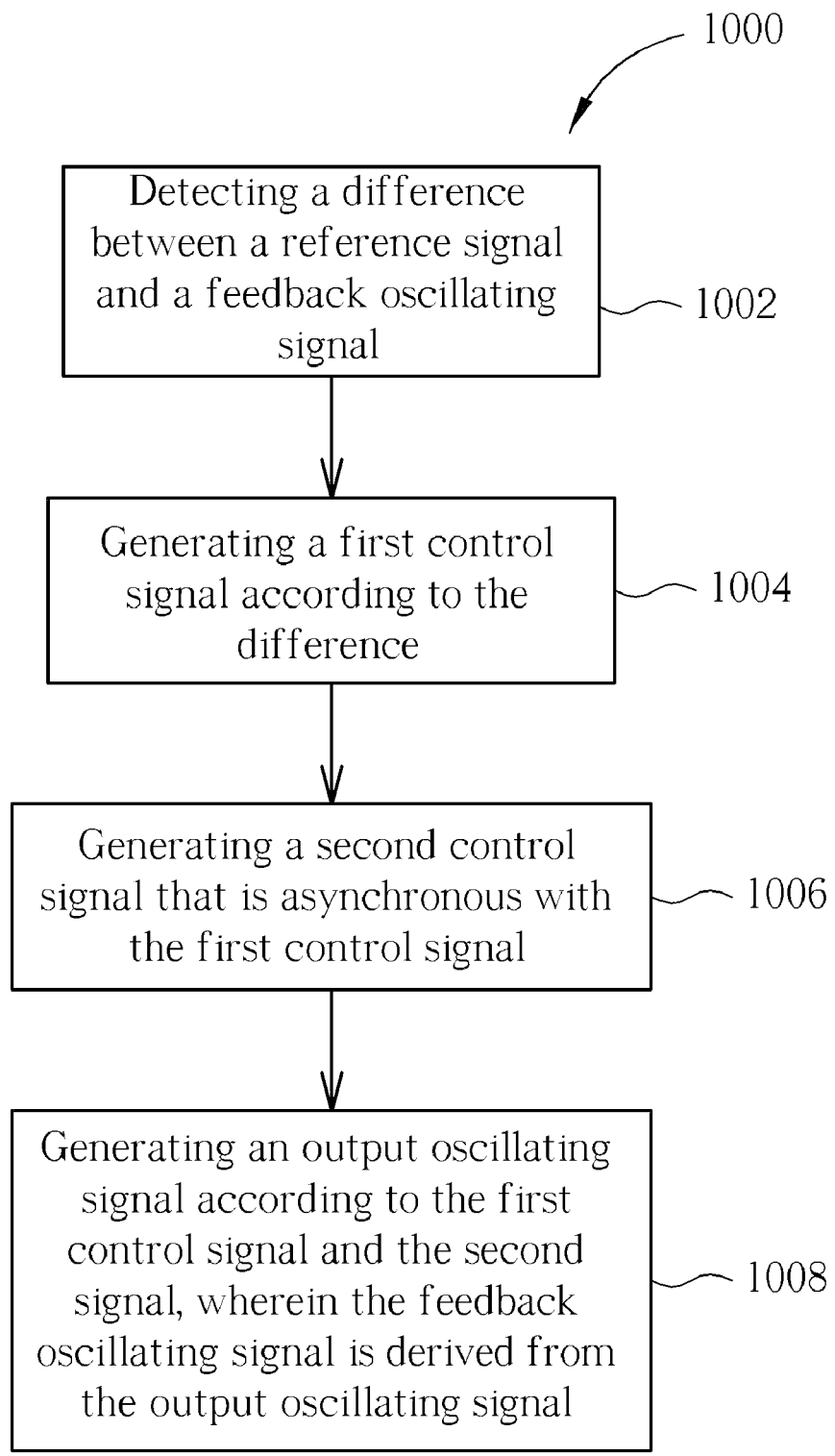
FIG. 10 is a flowchart illustrating a phase locking method for a phase-locked loop circuit according to an eighth embodiment of the present invention.

Please refer to FIG. 10. FIG. 10 is a flowchart illustrating a phase locking method 1000 for a phase-locked loop circuit according to an eighth embodiment of the present invention. Please note that the phase-locking method 1000 is applied in the above-mentioned phase-locked loop circuits 300, 500, 600, 700, 800, 900. Provided that substantially the same result is achieved, the steps of the flowchart shown in FIG. 10 need not be in the exact order shown and need not be contiguous, that is, other steps can be intermediate. The phase-locking method 1000 comprises the following steps:

Step 1002: detecting a difference (such as phase difference) between a reference signal and a feedback oscillating signal;

Step 1004: generating a first control signal according to the difference detected in step 1002;

Step 1006: generating a second control signal that is asynchronous with the first control signal;

Step 1008: generating an output oscillating signal according to the first control signal and the second signal, wherein the feedback oscillating signal is derived from the output oscillating signal.

Please refer to FIG. 3. The second control signal and the first control signal of the phase-locking method 1000 can be equated to the first control signal Sp' and the second control signal Si' of the phase-locked loop circuit 300, respectively. Therefore, the step of generating the second control signal that is asynchronous with the first control signal (i.e., step 1006) includes frequency dividing the detected phase difference if necessary, delaying the frequency-divided results, and generating the second control signal according to the delayed results, such as charging a capacitor by the current generated according to the delayed results or integrating the signal corresponding to the delayed results. The detailed description of the steps 1002, 1004, and 1008 are omitted here for brevity since those skilled in this art will easily understand their respective operations after reading the above-mentioned disclosure related to the phase-lock loop circuit 300.

Please refer to FIG. 5. The second control signal and the first control signal of the phase-locking method 1000 can be equated to the first control signal Sp″ and the second control signal Sp2″ of the phase-lock loop circuit 500, respectively. Therefore, the step of generating the second control signal that is asynchronous with the first control signal (i.e., step 1006) includes frequency dividing the detected phase difference if necessary, integrating a signal corresponding to the frequency-divided results, selectively providing the integrated signal to the controllable oscillator 516 in order to generate the second control signal that is asynchronous with the first control signal. Similarly, the detailed description of the steps 1002, 1004, and 1008 are omitted here for brevity since those skilled in this art will easily understand their operations after reading the above-mentioned disclosure related to the phase-locked loop circuit 500.

Please refer to FIG. 8. The second control signal and the first control signal of the phase-locking method 1000 can be equated to the first control signal Sp‴ and the second control signal Si‴ of the phase-locked loop circuit 800 respectively. Therefore, the step (i.e., step 1006) of generating the second control signal that is asynchronous with the first control signal includes frequency dividing the reference signal to generate a first frequency-divided signal (if necessary), frequency dividing the output oscillating signal to generate a second frequency-divided signal (if necessary), detecting the phase difference between the first and the second frequency-divided signals, integrating a signal corresponding to the detected phase difference, and selectively providing the integrated signal to the controllable oscillator to generate the second control signal that is asynchronous with the first control signal. Similarly, the detailed description of the steps 1002, 1004, and 1008 are omitted here for brevity since those skilled in this art will easily understand their operations after reading the above-mentioned disclosure related to the phase-locked loop circuit 800.

Please refer to FIG. 9. The second control signal and the first control signal of the phase-locking method 1000 can be equated to the first control signal Sp″″ and the second control signal Si″″ of the phase-locked loop circuit 900 respectively. Therefore, the step (i.e., step 1006) of generating the second control signal that is asynchronous with the first control signal includes frequency dividing the reference signal to generate a first frequency-divided signal (if necessary), frequency dividing the output oscillating signal to generate a second frequency-divided signal (if necessary), detecting the phase difference between the first and the second frequency-divided signals, delaying the detected phase difference, generating the second control signal according to the delayed results. Similarly, the detailed description of the steps 1002, 1004, and 1008 are omitted here for brevity since those skilled in this art will easily understand their operations after reading the above-mentioned disclosure related to the phase-locked loop circuit 900.

In above embodiments, the VCO is illustrated with two separate control ends respectively for I-path control and P-path control. Inside the VCO, there may be an adder which adds the I-path control signal to the P-path control signal before the VCO generates the output oscillating signal. However, as a person with ordinary skill in the art will appreciate, the I-path control signal and the P-path control signal can first be added, and the sum is then sent into the VCO. These modifications shall all fall within the scope of the present invention as long as the I-path control signal and the P-path control signal are asynchronous or the update frequency of the I-path control signal is lower than that of the P-path control signal.

Those skilled in the art will readily observe that numerous modifications and alterations of the device and method may be made while retaining the teachings of the invention.

What is claimed is:

1. A phase-locked loop circuit, comprising:
   an operating circuit, for detecting a difference between a reference signal and a feedback oscillating signal to generate a detected result, and generating a first control signal according to the detected result;
   an auxiliary circuit, for generating a second control signal that is asynchronous with the first control signal; and
   a controllable oscillator, coupled to the operating circuit and the auxiliary circuit, for generating an output oscillating signal according to the first control signal and the second control signal;
   wherein the feedback oscillating signal is derived from the output oscillating signal.

2. The phase-locked loop circuit of claim 1, wherein an update frequency of the second control signal is lower than an update frequency of the first control signal.

3. The phase-locked loop circuit of claim 2, further comprising:
   a first frequency dividing circuit, coupled between the operating circuit and the controllable oscillator, for dividing the output oscillating signal by a frequency-dividing factor equal to N/M to generate the feedback oscillating signal;
   wherein the auxiliary circuit comprises:
      a second frequency dividing circuit, for dividing the reference signal to generate a first frequency-divided signal according to a frequency-dividing factor equal to M, and dividing the output oscillating signal to generate a second frequency-divided signal according to a frequency-dividing factor equal to N;
      a detecting circuit, coupled to the second frequency dividing circuit, for detecting a difference between the first frequency-divided signal and the second frequency-divided signal; and
      an adjusting circuit, coupled between the detecting circuit and the controllable oscillator, for generating the second control signal according to an output of the detecting circuit.

4. The phase-locked loop circuit of claim 3, wherein the adjusting circuit comprises:
   a first integrator, having a connection terminal coupled to the detecting circuit.

5. The phase-locked loop circuit of claim 4, wherein the adjusting circuit further comprises:
   a second integrator, having a connection terminal coupled to the controllable oscillator; and
   a switch circuit, coupled between the connection terminal of the first integrator and the connection terminal of the second integrator, for selectively coupling the first integrator to the second integrator to generate the second control signal which is asynchronous with the first control signal.

6. The phase-locked loop circuit of claim 5, wherein the switch circuit is controlled by at least one of the first frequency-divided signal and the second frequency-divided signal.

7. The phase-locked loop circuit of claim 3, wherein the adjusting circuit comprises:
a delay circuit, coupled to the detecting circuit, for delaying the output of the detecting circuit to generate a delayed output; wherein the second control signal is generated according to the delayed output.

8. The phase-locked loop circuit of claim 7, wherein the output of the delay circuit does not overlap with the detected result of the operating circuit.

9. The phase-locked loop circuit of claim 1, wherein the auxiliary circuit comprises:
a delay circuit, for generating a delayed output according to the detected result of the operating circuit;
wherein the second control signal is generated according to the delayed output.

10. The phase-locked loop circuit of claim 9, wherein the delayed output does not overlap with the detected result.

11. The phase-locked loop circuit of claim 9, wherein the auxiliary circuit further comprises:
a frequency dividing circuit, coupled to the operating circuit and the delay circuit, for downsampling the difference between the reference signal and the feedback oscillating signal;
wherein the delay circuit generates the delayed output by delaying an output of the frequency dividing circuit.

12. The phase-locked loop circuit of claim 1, wherein the auxiliary circuit comprises:
a frequency dividing circuit, coupled to the operating circuit, for downsampling the difference between the reference signal and the feedback oscillating signal to generate a downsampled signal;
wherein the second control signal is generated according to the downsampled signal.

13. The phase-locked loop circuit of claim 1, wherein the auxiliary circuit comprises:
a first integrator, receiving a signal corresponding to the difference between the reference signal and the feedback oscillating signal;
a second integrator, coupled to the controllable oscillator; and
a switch circuit, coupled between the first and the second integrators, for selectively coupling the first integrator to the second integrator to generate the second control signal.

14. The phase-locked loop circuit of claim 13, wherein the switch circuit is controlled by the reference signal.

15. The phase-locked loop circuit of claim 13, wherein the auxiliary circuit further comprises:
a frequency dividing circuit, coupled to the operating circuit, for downsampling the difference between the reference signal and the feedback oscillating signal to generate a downsampled signal;
wherein the first integrator receives a signal corresponding to the downsampled signal, and the switch circuit is controlled by the downsampled signal.

16. The phase-locked loop circuit of claim 15, wherein the frequency dividing circuit downsamples the detected result according to a frequency-dividing factor, and the auxiliary circuit further comprises:
a dithering circuit, coupled to the frequency dividing circuit and the switch circuit, for dithering the frequency-dividing factor.

17. The phase-locked loop circuit of claim 1, further comprising a low pass filter, coupled to the auxiliary circuit and the controllable oscillator, for filtering the second control signal and providing the filtered second control signal to the controllable oscillator.

18. A phase-locking method, comprising:
detecting a difference between a reference signal and a feedback oscillating signal to generate a first output;
generating a first control signal according to the difference;
generating a second control signal that is asynchronous with the first control signal; and
generating an output oscillating signal according to the first control signal and the second control signal, wherein the feedback oscillating signal is derived from the output oscillating signal.

19. The phase-locking method of claim 18, wherein an update frequency of the second control signal is lower than an update frequency of the first control signal.

20. The phase-locking method of claim 19, further comprising:
dividing the output oscillating signal by a frequency-dividing factor equal to N/M to generate the feedback oscillating signal;
wherein the step of generating the second control signal comprises:
dividing the reference signal to generate a first frequency-divided signal according to a frequency-dividing factor equal to M, and dividing the output oscillating signal to generate a second frequency-divided signal according to a frequency-dividing factor equal to N;
detecting a difference between the first frequency-divided signal and the second frequency-divided signal to generate a second output; and
generating the second control signal according to the second output.

21. The phase-locking method of claim 18, wherein the step of generating the second control signal comprises:
generating a delayed output according to the first output; and
generating the second control signal according to the delayed output.

22. The phase-locking method of claim 21, wherein the step of generating the second control signal further comprises:
downsampling the first output to generate a downsampled output;
wherein the delayed output is generated by delaying the downsampled output.

23. The phase-locking method of claim 18, wherein the step of generating the second control signal comprises:
downsampling the difference between the reference signal and the feedback oscillating to generate a downsampled signal; and
generating the second control signal according to the downsampled signal.

24. The phase-locking method of claim 18, wherein the step of generating the second control signal comprises:
integrating the first output; and
selectively providing the integrated result to generate the second control signal.

25. The phase-locking method of claim 18, wherein the step of generating the second control signal comprises:
downsampling the first output to generate a downsampled output;
integrating the downsampled output; and
selectively providing the integrated result to generate the second control signal.

26. The phase-locking method of claim 25, wherein the step of downsampling the first output is performed according to a frequency-dividing factor, and the step of generating the second control signal further comprises:
dithering the frequency-dividing factor.

27. A phase-locked loop circuit, comprising:
- an operating circuit, for detecting a difference between a reference signal and a feedback oscillating signal to generate a first control signal;
- a downsampling circuit, coupled to the operating circuit, for downsampling the difference between the reference signal and the feedback oscillating signal;
- an auxiliary circuit, coupled to the downsampling circuit, for generating a second control signal according to an output of the downsampling circuit; and
- a controllable oscillator, coupled to the operating circuit and the auxiliary circuit, for generating an output oscillating signal according to the first control signal and the second control signal, wherein the feedback oscillating signal is derived from the output oscillating signal.

* * * * *